(12) United States Patent
Kitamura et al.

(10) Patent No.: US 6,443,298 B2
(45) Date of Patent: *Sep. 3, 2002

(54) SURFACE PACKAGE TYPE SEMICONDUCTOR PACKAGE AND METHOD OF PRODUCING SEMICONDUCTOR MEMORY

(75) Inventors: Wahei Kitamura, Kodaira; Gen Murakami, Machida; Kunihiko Nishi, Kokubunji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/843,937

(22) Filed: Apr. 30, 2001

Related U.S. Application Data

(60) Continuation of application No. 09/387,049, filed on Aug. 31, 1999, now Pat. No. 6,223,893, which is a continuation of application No. 09/094,490, filed on Jun. 10, 1998, now Pat. No. 5,988,368, which is a continuation of application No. 08/712,559, filed on Sep. 13, 1996, now Pat. No. 5,803,246, which is a continuation of application No. 08/264,745, filed on Jun. 23, 1994, now Pat. No. 5,607,059, which is a continuation of application No. 07/791,539, filed on Nov. 14, 1991, now abandoned, which is a continuation of application No. 07/392,029, filed on Aug. 10, 1989, now Pat. No. 5,095,626, which is a division of application No. 07/124,925, filed on Nov. 23, 1987, now abandoned.

(30) Foreign Application Priority Data

Nov. 25, 1986 (JP) .............................. 61-278610
Aug. 21, 1987 (JP) .............................. 62-206290

(51) Int. Cl.[7] .............................................. B65D 73/02

(52) U.S. Cl. ..................................... 206/204; 206/720

(58) Field of Search ................................ 206/204, 701, 206/710, 720; 361/212, 220; 428/922

(56) References Cited

U.S. PATENT DOCUMENTS 2,251,609 A 8/1941 Freeburg
2,446,361 A 8/1948 Clibbon (List continued on next page.)

FOREIGN PATENT DOCUMENTS

DE 0922516 1/1955
DE 2821162 11/1977

(List continued on next page.)

OTHER PUBLICATIONS

"SIMCO–STAT Transparent Static Barrier Bags", May 1982.
"Quality Packaging Supply Corp. XT6000 Heat–Sealable, Static Shielding Material" (no date).

(List continued on next page.)

Primary Examiner—David T. Fidei
(74) Attorney, Agent, or Firm—Antonelli, Terry, Stout & Kraus, LLP

(57) ABSTRACT

In surface packaging of thin resin packages such as surface mount resin molded memory ICs or the like, cracks of the package occur frequently at a solder reflow step where thermal impact is applied to the package because the resin has absorbed moisture before packaging. To solve this problem, the devices are sealed, by heat-sealing, in a bag moisture-tight at an assembly step of the resin molded devices where the resin is still dry, and are taken out from the bags immediately before the execution of surface packaging. The devices are packaged in a moisture-proofing bag made of a laminate film, and a desiccant is sealed, by heat-sealing the bag, in the moisture-proofing bag together with the, e.g., surface mount semiconductor device having a plastic package encapsulating the semiconductor device. A caution is provided for the bag, that the devices should be presented from moisture absorption after opening the bag.

29 Claims, 12 Drawing Sheets

U.S. PATENT DOCUMENTS

| | | |
|---|---|---|
| 2,611,481 A | 9/1952 | Sargeant |
| 2,674,509 A | 4/1954 | Barnet |
| 2,814,382 A | 9/1957 | Lassiter |
| 3,041,796 A | 7/1962 | Forest |
| 3,399,763 A | 9/1968 | Potter |
| 3,405,796 A | 10/1968 | Misik |
| 3,454,154 A | 7/1969 | Peters et al. |
| 3,625,931 A | 12/1971 | Ito et al. |
| 3,704,806 A | 12/1972 | Plachenov et al. |
| 3,891,709 A | 6/1975 | Higuchi et al. |
| 3,909,504 A | 9/1975 | Browne |
| 3,959,526 A | 5/1976 | Swerlick |
| 4,026,008 A | 5/1977 | Drees et al. |
| 4,049,121 A | 9/1977 | White |
| 4,091,165 A | 5/1978 | Hayama |
| 4,154,344 A | 5/1979 | Yenni, Jr. et al. ......... 206/524.6 |
| 4,156,751 A | 5/1979 | Yenni, Jr. et al. |
| 4,156,757 A | 5/1979 | Graser |
| 4,160,503 A | 7/1979 | Ohlbach |
| 4,164,503 A | 8/1979 | Ohlbach |
| 4,171,049 A | 10/1979 | Mohara et al. |
| 4,206,844 A | 6/1980 | Thukamoto |
| 4,208,696 A | 6/1980 | Lindsay et al. |
| 4,293,070 A | 10/1981 | Ohlbach |
| 4,298,710 A | 11/1981 | Ohya et al. |
| 4,407,872 A | 10/1983 | Mori |
| 4,421,235 A | 12/1983 | Moriya |
| 4,424,900 A | 1/1984 | Petcavich |
| 4,480,747 A | 11/1984 | Kazor et al. |
| 4,496,406 A | 1/1985 | Dedow |
| 4,528,222 A | 7/1985 | Rzepecki et al. |
| 4,529,087 A | 7/1985 | Neal et al. |
| 4,565,228 A | 1/1986 | Walther |
| 4,590,534 A | 5/1986 | Akamatsu et al. |
| 4,648,508 A | 3/1987 | Neal et al. |
| 4,658,958 A | 4/1987 | McNully et al. |
| 4,661,376 A | 4/1987 | Liany |
| 4,681,218 A | 7/1987 | Williams |
| 4,684,020 A | 8/1987 | Ohlbach |
| 4,686,776 A | 8/1987 | Matsubara |
| 4,695,926 A | 9/1987 | McDermott |
| 4,699,830 A | 10/1987 | White |
| 4,721,207 A | 1/1988 | Kikuchi ..................... 206/204 |
| 4,746,697 A | 5/1988 | Yamaguchi et al. |
| 4,756,414 A | 7/1988 | Mott |
| 4,757,964 A | 7/1988 | Kincaid et al. |
| 4,760,916 A | 8/1988 | Koneko et al. |
| 4,767,004 A | 8/1988 | Ishihara et al. |
| 4,780,357 A | 10/1988 | Akao |
| 4,800,115 A | 1/1989 | Havens |
| 4,804,580 A | 2/1989 | Noding et al. |
| 4,852,732 A | 8/1989 | Wilski et al. |
| 4,866,506 A | 9/1989 | Nambu et al. |
| 4,875,581 A | 10/1989 | Ray et al. |
| 4,906,494 A | 3/1990 | Babinec et al. ............. 206/720 |
| 4,971,196 A * | 11/1990 | Kitamura et al. ........... 206/204 |
| 5,095,626 A * | 3/1992 | Kitamura et al. ............. 29/827 |
| 5,607,059 A * | 3/1997 | Kitamura et al. ........... 206/720 |
| 5,803,246 A * | 9/1998 | Kitamura et al. ........... 206/204 |
| 5,988,368 A * | 11/1999 | Kitamura et al. ........... 206/204 |
| 6,223,893 B1 * | 5/2001 | Kitamura et al. ........... 206/720 |

FOREIGN PATENT DOCUMENTS

| | | |
|---|---|---|
| DE | 3208259 | 1/1987 |
| DE | 3624194 | 1/1987 |
| EP | 0038179 | 4/1981 |
| EP | 0154428 | 9/1985 |
| EP | 208259 | 1/1987 |
| FR | 1140952 | 3/1957 |
| FR | 2326347 | 4/1977 |
| GB | 1128155 | 10/1965 |
| JP | 5568348 | 5/1980 |
| JP | 60036105 | 6/1985 |
| JP | 60208846 | 10/1985 |
| JP | 60208847 | 10/1985 |
| JP | 60226145 | 11/1985 |
| JP | 6133444 | 2/1986 |
| JP | 178877 | 8/1986 |
| JP | 61184854 | 8/1986 |
| JP | 61184856 | 8/1986 |
| JP | 317238 | 3/1991 |

OTHER PUBLICATIONS

"BayState Inc. Transparent Static Shield Bags" (no date).
"Ameri–Stat Static Shield Bags"(Aug. 1986).
Improvement in Reliability of Flat Plastic IC Package from the Viewpoint of Solder Mounting, Hitachi, Ltd., Musashi Factory, Akira Suzuki, Gen Murakami, Masanori Sakimoto with English translation, May 1984, pp. 303–306.
Packaging Engineer vol. 28 #1 "Transparent bags foil static electricity's zap", Jan. 1983.

* cited by examiner

FIG. 21
FIG. 21A
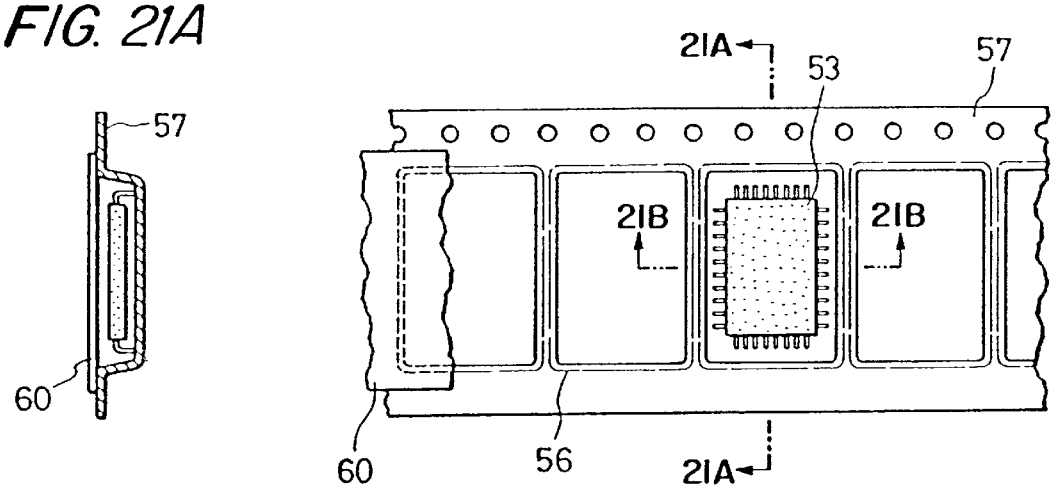
FIG. 21B
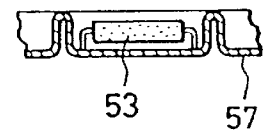

SURFACE PACKAGE TYPE SEMICONDUCTOR PACKAGE AND METHOD OF PRODUCING SEMICONDUCTOR MEMORY

This application is Continuation application of application Ser. No. 09/387,049, filed Aug. 31, 1999, now U.S. Pat. No. 6,223,893, which is a Continuation application of application Ser. No. 09/094,490, filed Jun. 10, 1998, now U.S. Pat. No. 5,988,368, the contents of which are incorporated herein by reference in their entirety, which is a Continuation application of application Ser. No. 08/712,559, filed Sep. 13, 1996, now U.S. Pat. No. 5,803,246, which is a continuation application of application Ser. No. 08/264,745, filed Jun. 23, 1994, now U.S. Pat. No. 5,607,059, which is a Continuation application of application Ser. No. 07/791,539, filed Nov. 14, 1991, now abandoned, which is a Continuation application of application Ser. No. 07/392,029, filed Aug. 10, 1989, now U.S. Pat. No. 5,095,626, which is a Divisional application of application Ser. No. 07/124,925, filed Nov. 23, 1987, now abandoned.

BACKGROUND OF THE INVENTION

This invention relates to a technique for preventing peel of a package interface and crack when a surface package type semiconductor package is mounted to a packaging substrate such as a printed circuit board.

In surface mount package type semiconductor packages such as a small outline package (SOP), a squad flat package (QFP), a plastic leaded chip carrier (PLCC), and the like, the size and thickness of the packages are more and more reduced in order to cope with the increase in the size of a semiconductor chip stored in the package and package strength tends to decrease.

Therefore, it has become difficult to produce a thin resin molded IC having high reliability.

Incidentally, mention can be made of "IC PACKAGING TECHNIQUE", published by Kogyo Chosakai K. K., Jan. 15, 1980, pp. 135–156, as a prior art reference describing surface package type semiconductor packages.

Furthermore, as disclosed in Japanese Patent Laid-Open No. 178877/1986 by Otsuka et al. (Aug. 11, 1986), a proposal has been made to put a desiccant into a magazine or to seal a conveying tray in a bag of a vinyl sheet or the like.

SUMMARY OF THE INVENTION

When examining packaging reliability and strength of these thin type packages, the inventors of the present invention have found out that when heat is applied to the package when surface-mounting the package to a mounting substrate such as a printed circuit board such as at the time of solder reflow, a moisture that has entered the package causes drastic volume expansion and peel of the package interface and crack develops.

To cope with this problem, it has been customary to bake the package at 125° C., for example, for a period as long as 16 to 24 hours before solder reflow, but this method is believed inefficient because a furnace for baking must be prepared and particularly because baking must be made for the long period.

As a result of examination of the origin of the moisture causing the cracking described above, the inventors of the invention have clarified that the moisture in the air enters the package during the period from transfer molding of a chip component by a resin to solder reflow and is likely caused to dew.

Though the Otsuka et al. method described already provides a considerable effect, the problem cannot be solved completely by this method in view of the recent product situation where the thickness and size of the packages are reduced more and more to store greater chips and of the severe environment where the products are shipped by airplanes.

It is therefore an object of the present invention to provide a technique which prevents interface peeling and cracking of a surface mount package type package.

It is another object of the present invention to provide a highly reliable high density packaging technique.

It is still another object of the present invention to provide an efficient solder reflow technique.

It is still another object of the present invention to provide an effective shipment method of electronic components.

It is a further object of the present invention to provide an effective preservation method of semiconductor devices sealed by a thin resin package.

It is still another object of the present invention to provide high freedom for the conditions of executing an assembly process.

It is still another object of the present invention to provide an assembly process which will be suitable for surface mount package.

It is still another object of the present invention to provide an efficient surface mount type packaging technique.

It is still another object of the present invention to improve moisture-proofness of resin-molded ICs, or the like.

It is still another object of the present invention to provide a packaging technique of resin-molded ICs or the like which will be suitable for automatic packaging.

It is still another object of the present invention to provide a preservation method of ICs, components, electronic devices, and the like, which have high moisture-proofness and do not require baking even when stored for a long period.

It is still another object of the present invention to provide a packaging method of electronic components such as ICs which can easily discriminate the existence of pin-holes.

It is still another object of the present invention to provide a moisture-proofing package technique of ICs or the like which does not need a large space requirement.

It is still another object of the present invention to provide a moisture-proofing packaging technique of ICs or the like which can easily judge the degree of hygroscopicity of ICs or the like.

It is still another object of-the present invention to provide a moisture-proofing bag having a display portion for displaying the degree of hygroscopicity of ICs or the like.

It is still another object of the present invention to provide a package member for surface package type packages which can easily represent the degree of hygroscopicity of ICs or the like.

It is still another object of the present invention to provide an efficient surface mounting method of resin-molded ICs or the like.

It is still another object of the present invention to provide an assembly process which will be suitable for resin-molded electronic components storing therein integrated circuits having a large chip size.

It is still another object of the present invention to provide a shipment method of electronic devices such as resin-molded ICs which will-be suitable for the shipment of the electronic devices by air planes.

It is still another object of the present invention to provide a moisture-proofing packaging technique of resin-molded ICs or the like which does not undergo dewing even at low temperatures.

It is still another object of the present invention to provide a technique which can confirm the state of hygroscopicity of a moisture-proofing package inside the package from the outside thereof.

These and other objects and novel features of the present invention will become more apparent from the following detailed description when taken in conjunction with the accompanying drawings.

Among the inventions disclosed herein, a typical example is as follows.

In the present invention, a surface mount package type package stored in a magazine is put into an interior box, the interior box is then placed into a transparent resin bag using, as the base, a polyester having moisture permeability of up to 2.0/m$^2$·24 hrs, for example, and having a surface intrinsic resistance of $10^6$ Ohms on the outside and up to $10^{11}$ Ohms on the inner side, and the open portion of the bag is heat-sealed after removing the air. Furthermore, a desiccant such as silica gel is put into the interior box.

According to this arrangement described above, the surface mount package type package is stored in the interior box and the moisture-proofing bag outside the box and sealed completely by deaeration and heat seal and is free from the influences of external moisture. Therefore, the interface peel and crack of the package do not occur even after solder reflow without the need of the troublesome baking operation. Particularly because the polyester having moisture permeability of up to 2.0 g/m$^2$·24 hours is used as the base of the resin bag in the present invention, moisture-proofness is high and heat seal is possible so that the effect of checking intrusion of the external air is high. The surface intrinsic resistance of the bag is up to $10^{11}$ ohms on its inner surface and up to $10^6$ ohms on its outer surface in order to prevent any charge. Furthermore, silica gel is placed between the magazine and the wall surface of the interior box in the present invention in order to absorb the moisture so that the surface package type package is not much affected by the external moisture.

Still another example of the inventions disclosed herein is as follows.

Namely, the present invention provides a transparent moisture-proofing packaging bag for moisture-proofing and packaging an electronic component, which bag is equipped with a moisture indicator for detecting the degree of hygroscopicity inside the moisture-proofing bag at a portion which is visible from outside.

According to the means described above, since the moisture indicator for detecting the moisture inside the transparent moisture-proofing bag is disposed at a position visible from outside, the degree of hygroscopicity of the bag can be confirmed from outside the bag.

Still another typical example of the inventions disclosed herein provides a package which comprises a semiconductor chip on which at least one electronic device is formed, a resin-molding member covering at least a part of the main plane of the semiconductor chip, and a moisture-proofing bag comprising a multi-layered film containing at least one metal sheet, for cutting off the resin-molding member from outside.

Still another typical example of the inventions disclosed herein provides a package of a number of (about 10) resin-molded semiconductor devices which are stored in a plastic magazine, whose outside portion is sealed air-tight by a moisture-proofing film.

Still another typical example of the inventions disclosed herein provides an air-tight package made of a moisture-proofing film and including a number of resin-molded semiconductor devices, a plurality of device storing magazines storing therein a line of resin-molded semiconductor devices, an interior box for aligning a plurality of magazines and storing them therein while they are in close contact with one another, a packaging bag made of a moisture-proofing sheet member, storing therein the interior box and sealed air-tight, and a desiccant placed in the packaging bag.

Still another typical example of the inventions disclosed herein provide an air-tight package for a number of surface mount package type resin-molded semiconductor devices which comprises an exterior box made of a cardboard, a number (at least five to six) of packaging bags made of a moisture-proofing film and sealed air-tight, a plurality of interior boxes made of paper and stored in the packaging bag, a plurality of tube-like magazines for conveying semiconductor devices, stored in the interior boxes, respectively, a number of surface package type resin-molded semiconductor integrated circuit devices stored in the magazines, respectively, and a desiccant stored in each of the interior boxes.

Still another typical example of the inventions disclosed herein provides an air-tight package for a large number of surface mount package type resin-molded semiconductor integrated circuit devices which comprises an exterior box made of cardboard, a plurality of packaging bags made of a moisture-proofing film and sealed air-tight inside the exterior box, at least one conveying auxiliary member for protecting a number (at least five to six) of resin-molded semiconductor devices stored in the packaging bags, a number of resin-molded semiconductor integrated circuit devices stored in or on the auxiliary member, and a desiccant stored in each of the packaging boxes.

Still another typical example of the inventions disclosed herein provides an air-tight package for at least one resin-molded semiconductor device which comprises a packaging bag made of a moisture-proofing film, at least one conveying auxiliary member stored in the packaging bag, at least one resin-molded semiconductor device stored in the packaging bag and stored in or on the auxiliary member, and a desiccant placed in the packaging bag.

Still another typical example of the inventions disclosed herein provides an air-tight package for at least one resin-molded semiconductor device which comprises a packaging bag made of a moisture-proofing film and sealed air-tight, at least one resin-molded semiconductor device stored in the packaging bag, and a desiccant placed in the packaging bag.

Still an-other typical example of the inventions disclosed herein provides an air-tight package for at least one resin-molded semiconductor device which comprises a packaging bag made of a moisture-proofing film and sealed air-tight, at least one resin-molded semiconductor device stored in the packaging bag, and a desiccant stored in the packaging bag or formed on the inner surface of the packaging bag.

Still another typical example of the inventions disclosed herein provides a package comprising a semiconductor chip on which at least one electronic device is formed, a moisture-proofing bag for cutting off the semiconductor chip from outside, and humidity display means disposed in the moisture-proofing bag and capable of being recognized from inside.

Still another typical example of the inventions disclosed herein provides a package comprising a tube-like magazine for storing a line of a number (at least five to six) of resin-molded semiconductor devices, a number of resin-molded semiconductor devices stored in the magazine, and humidity display means disposed in the magazine in such a manner as to be visible from outside.

Still another typical example of the inventions disclosed herein provides a package for a large number (at least ten) of resin-molded semiconductor devices, sealed air-tight by a moisture-proofing film, said package being equipped there-inside with humidity display means in such a manner as to be visible from outside.

Still another typical example of the inventions disclosed herein provides an air-tight package made of a moisture-proofing film, which comprises a number of resin-molded semiconductor devices, a plurality of device storing magazines for storing therein a number of resin-molded semiconductor devices aligned in a line, an interior box for storing therein a plurality of magazines while being aligned and in close contact with one another, a packaging bag for storing therein the interior box, made of a moisture-proofing sheet and sealed air-tight, and humidity display means disposed inside the packaging bag in such a manner as to be visible from outside.

Still another typical example of the inventions disclosed herein provides an air-tight package for a number of surface package type resin-molded semiconductor integrated circuit devices, which comprises an exterior box made of cardboard, a number (at least five to six) of packaging bags made of a moisture-proofing film, sealed air-tight and stored in the exterior box, a plurality of interior boxes made of paper and stored in the packaging bag, a plurality of tube-like magazines for conveying semiconductor devices, stored in the interior boxes, respectively, a number of surface mount package type resin-molded semiconductor integrated circuit devices stored in a plurality of magazines, respectively, and humidity display means for displaying an internal humidity of said packaging bag, disposed inside the packaging bag in such a manner as to be visible from outside the packaging bag.

Still another typical example of the inventions disclosed herein provides an air-tight package for a number of surface package type resin-molded semiconductor integrated circuit devices which comprises an exterior box, a plurality of packaging bags made of a moisture-proofing bag and stored in the exterior box, at least one conveying auxiliary member for protecting a number (five to six) of resin-molded semiconductor devices stored in the packaging bag, a number of resin-molded semiconductor integrated circuit devices stored in or on the auxiliary member, and humidity display means for displaying the internal humidity of the packaging bag, disposed in the packaging bag in such a manner as to be visible from outside.

Still another typical example of the inventions disclosed herein provide an air-tight package for at least one resin-molded semiconductor device, which comprises a packaging bag made of a moisture-proofing film and sealed air-tight, at least one conveying auxiliary member stored in the packaging bag, at least one resin-molded semiconductor device stored in the packaging bag and stored in or on the auxiliary member, and humidity display means disposed in the packaging bag in such a manner as to be visible from outside.

Still another typical example of the inventions disclosed herein provides an air-tight package for at least one resin-molded semiconductor device, which comprises a packaging bag made of a moisture-proofing bag and sealed air-tight, at least one resin-.molded semiconductor device stored in the packaging bag, and humidity display means disposed in the packaging bag in such a manner as to be visible from outside.

Still another typical example of the inventions disclosed herein provides an air-tight package for at least one resin-molded semiconductor device, which comprises a packaging bag made of a moisture-proofing film and sealed air-tight, at least one resin-molded semiconductor device stored in the packaging bag, and a drying member stored or formed inside the packaging bag in such a manner as to be visible from outside.

Still another typical example of the inventions disclosed herein provides an air-tight package for a number of resin-molded semiconductor devices, which comprises a carrier tape made of a first moisture-proofing resin sheet and having device storing recesses, a plurality of resin-molded semiconductor devices stored in the recesses, and a second moisture-proofing resin sheet covering the upper surface of the recesses and sealed in such a manner as to keep the inside of the recesses air-tight.

Still another typical example of the inventions disclosed herein provides a packaging method of resin-molded semiconductor devices, which comprises the steps of preserving the resin-molded devices in a moisture-proofing bag lest they should absorb moisture, taking out the resin-molded devices from the moisture-proofing bag, and placing the resin-molded devices on a wiring substrate and soldering the leads of the resin-molded devices to the wirings on the wiring substrate under such a condition where the resin-molded portion receives thermal impact.

Still another typical example of the inventions disclosed herein provides a method of shipping a large number of resin-molded semiconductor devices by an air plane, which comprises sealing air-tight the resin-molded semiconductor devices together with a desiccant in a moisture-proofing bag.

Still another typical example of the inventions disclosed herein provides a method of fabricating resin-molded semiconductor devices, which comprises the steps of sealing a semiconductor chip and inner leads by a resin, putting an ink mark to the resulting resin-molded member, exposing the resin-molded member as a whole after marking to a high temperature for baking the ink, and sealing airtight the devices after completion before they absorb moisture.

Still another typical example of the inventions disclosed herein provides a method of fabricating a molded semiconductor memory device, which comprises the steps of fixing lead to semiconductor chip holding portions made of the same metal sheet as that of the leads through one of the main planes of the tip, bonding pads on the other main plane of the chip to inner leads by a bonding wire, coating an organic resin causing less occurrence of α-rays on at least a region of the other main plane of the chip, where memory cells are formed, forming a resin-molded member from which a plurality of leads projects, by molding the chip, the wires, the chip holding members and the inner leads by a resin, and packaging the resin-molded member by a moisture-proofing bag lest the resin-molded member absorbs the moisture.

BRIEF DESCRIPTION OF THE DRAWINGS

FIGS. 21, 21A and 21B shows examples of conveying auxiliary members used in embodiment of the present invention, with FIGS. 21A and 21B being views along line 21A—21A and line 21B—21B, respectively, in FIG. 21;

DESCRIPTION OF THE PREFERRED EMBODIMENTS

Hereinafter, the present invention will be described more definitely with reference to some preferred embodiments thereof shown in the accompanying drawings.

[Embodiment 1]

Figure 2:
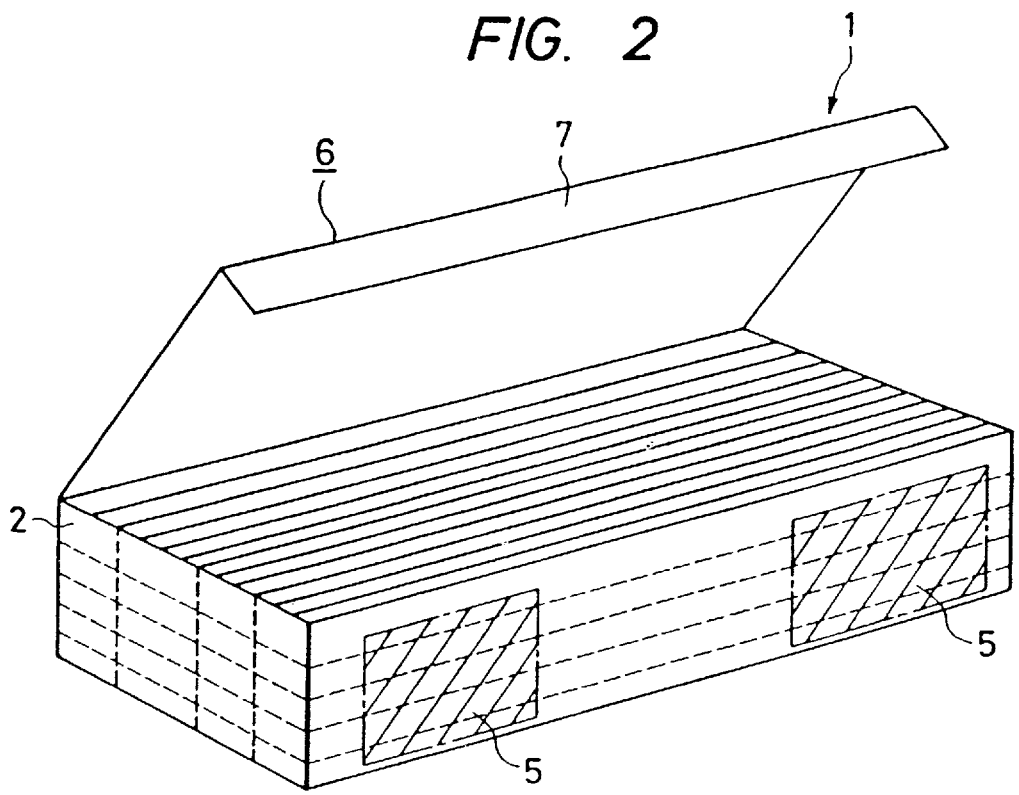
FIG. 2 is a perspective view of an interior box in the first embodiment described above.
Figure 3:
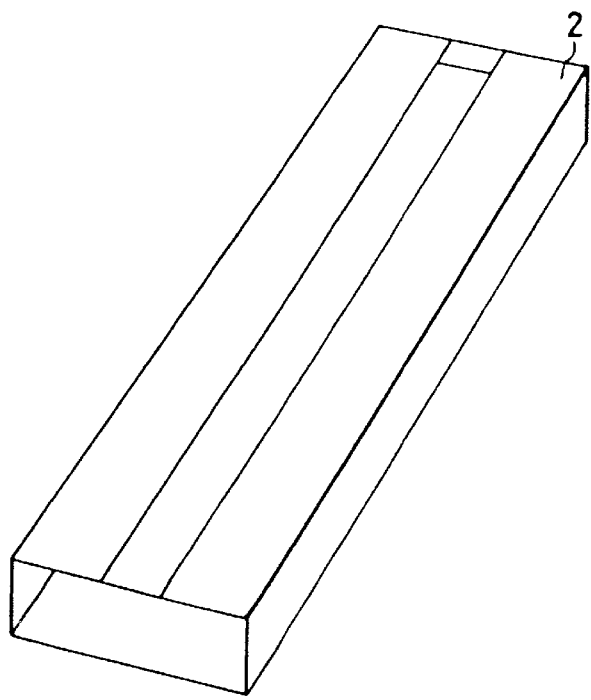
FIG. 3 is a perspective view showing an example of a magazine.
Figure 4:
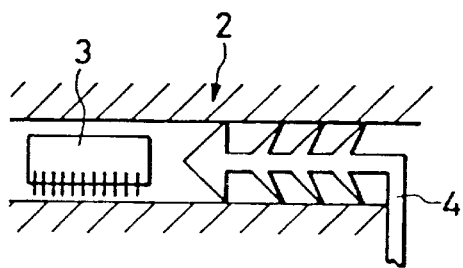
FIG. 4 is an explanatory sectional view of the end portion of the magazine.

A magazine 2 is stored in an interior box 1 made of paper, as shown in FIG. 2. An example of the magazine is shown in FIG. 3. A surface mount package type semiconductor package 3 is packaged into the magazine 2 and a stopper 4 is fitted to the end portion of the magazine 2 in order to prevent projection of the package 3 from the magazine 2.

A plurality of packages 3 are packaged into the magazine 2.

Silica gel 5 is put between the wall of the interior box 1 and tfie-side surfaces of the magazine 2 as shown in FIG. 2.

Preferably, the silica gel 5 is put into the end portions of the magazine for absorbing moisture. A flange 7 of a lid 6 is folded inward and the lid 6 is closed. When the package 3 is taken out by lifting up the lid 6, the end open side of the lid 6 is first affected by external moisture. For this reason, it is advisable to place the silica gel on the open side of the lid.

Figure 5:
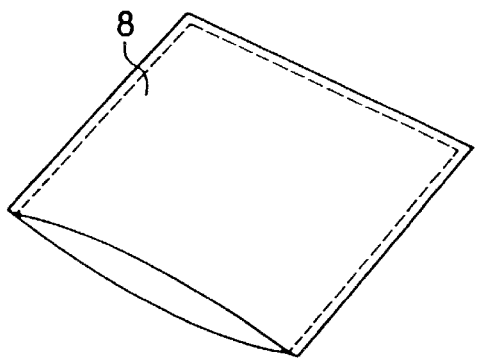
FIG. 5 is an explanatory view of an example of a bag.

The interior box 1 is put into a bag 8 such as shown in FIG. 5 and after deaeration, the open portion 9 of the bag 8 is heat-sealed.

The bag 8 is made of a transparent, electrically conductive bag using a polyester having moisture permeability of up to 2.0 g/m$^2$·24 hrs as the base.

If the bag 8 is transparent, it is very convenient for the management of the products because the kind of products, quantity, production lot number, and so forth, are put usually on the surface of the interior box 1.

An example of the resin films constituting the conductive bag 8 is a laminate film prepared by laminating a polyethylene containing an antistatic agent kneaded therein, a polyester film, a carbon conductive layer and an acrylic resin protective film in order named from the inside, and further coating a vinylidene chloride film on the laminate. To prevent charge of IC(s) inside the package 8, the surface intrinsic resistance of the conductive bag 8 is up to 10$^6$ ohms on the outer surface and up to 10$^{11}$ ohms on the inner surface.

Cautions to the effect that the devices should be used rapidly after opening the bag and the bag should be kept in the environment of low humidity are printed on the surface of the conductive bag 8 or a label 10 bearing such cautions is bonded to the conductive bag 8.

In accordance with the present invention, the surface mount package type package 3 is kept in the moisture-proofing bag 8 and is sealed completely by deaeration and heat seal 9. Since the silica gel 5 absorbs the moisture on the opening side and the package 3 is not affected by the external moisture, a troublesome baking operation becomes unnecessary and even after solder reflow, peel of interface and crack of the package can be prevented.

Other desiccants can be used in the embodiment described above in place of silica gel.

[Embodiment 2]

A second embodiment of the present invention will be explained definitely with reference to the drawings.

Figure 6:
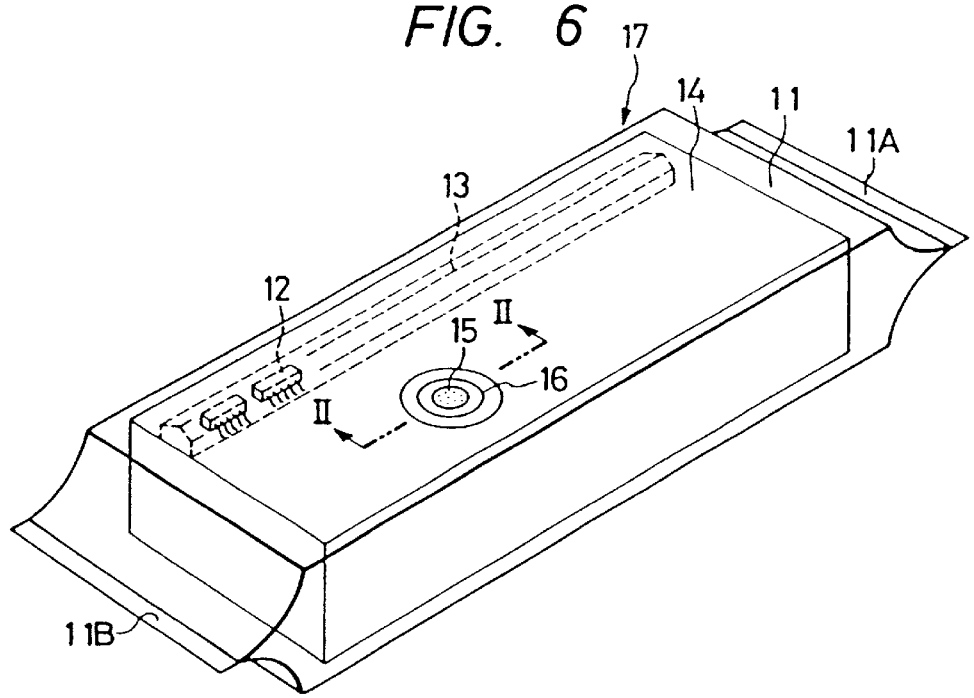
FIG. 6 is a perspective view showing the appearance and construction of a transparent moisture-proofing packaging bag in accordance with the second embodiment of the present invention.
Figure 7:
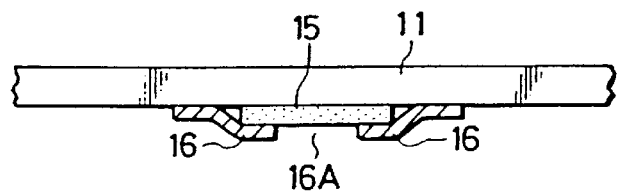
FIG. 7 is an enlarged sectional view taken along line II—II of FIG. 6 and shows the fitting portion of a humidity indicator fitted to the inner side surface of a transparent bag-like moisture-proofing member.
Figure 8:
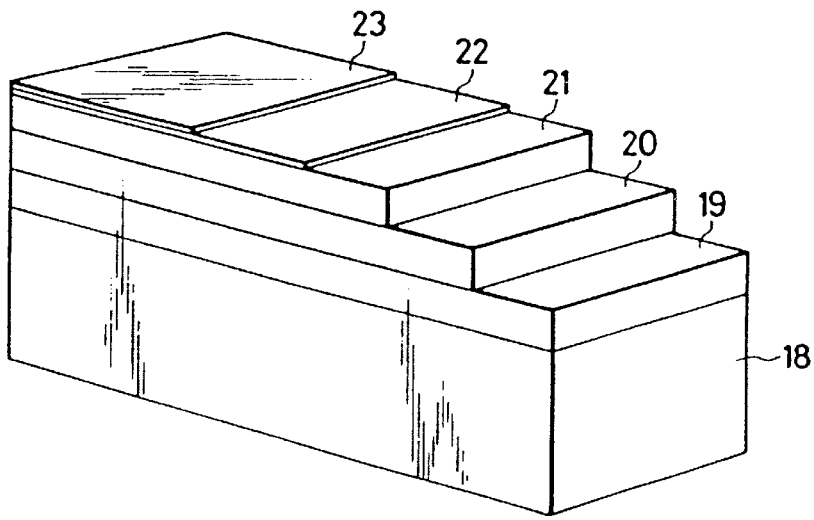
FIG. 8 is a partially cut-away perspective view showing the structure of the transparent bag-like moisture-proofing member of the moisture-proofing bag shown in FIG. 6.

In FIGS. 6 to 8 useful for explaining this embodiment, like reference numerals are used to identify like constituents and repetition of explanation of their function will be omitted.

FIG. 6 is a perspective view showing the appearance and structure of a transparent moisture-proofing packaging bag of this embodiment.

As shown in FIG. 6, the transparent moisture-proofing packaging bag of this embodiment is made of a transparent bag-like moisture-proofing member 11. A plurality of electronic components 12 such as surface mount package type semiconductor devices are stored in a container 13 and the containers 13 are stored in an interior box 14. Furthermore, the interior box 14 is stored in the bag-like moisture-proofing member 11, and both of its end portions 11A, 11B are sealed. When moisture-proofing packaging is made, a humidity indicator 15 for detecting the humidity inside the moisture-proofing packaging bag 17 is disposed on the inner side surface of the transparent bag-like moisture-proofing member 11 at a position where the indicator 15 can be seen from outside Examples of this humidity indicator 15 are as follows.
1. A caution is printed on the inner side surface of the transparent bag-like moisture-proofing member 11 by an ink containing a material which changes the color by moisture, such as cobalt chloride, which serves as the humidity indicator 15. For example, the caution reads as "When the color of this caution changes from blue to thin violet, take out surface package type semiconductor devices from the bag and bake them at 125° C. for 24 hours". pl 2. As shown in FIGS. 6 and 7, the humidity indicator (humidity detection label) 15 is bonded to the inner side of the transparent bag-like moisture-proofing member 11 by an adhesive 16 having vent holes 16A so that it can be confirmed from outside. This humidity detection label is prepared, for example, by letting paper made of a pulp absorb a material which changes color by humidity, such as cobalt chloride.
3. As shown in FIG. 6, the humidity indicator (humidity detection label) 15 is bonded to the interior box 14 inside the moisture-proofing packaging bag 17 or the caution is printed there by the material which changes color by moisture such as cobalt chloride.

Incidentally, when the humidity indicator (humidity detection label) 15 is bonded in the items 2 and 3 described above, there is no need to print the caution by the material which changes the color such as cobalt chloride.

Next, the structure of the transparent bag-like moisture-proofing member 11 comprises a laminate sheet as shown in FIG. 8.

In FIG. 8, reference numeral 18 represents a polyethylene layer into which an antistatic agent is kneaded. This is the innermost layer of the moisture-proofing packaging bag 17. The polyethylene layer 18 containing the antistatic agent is 63 μm-thick, for example, and has the functions of preventing frictional charge, heat sealability, openability, and so forth. A polyester film layer 19 having a pin-hole proofing function is disposed on the polyethylene layer 18 containing the antistatic agent. A polyester film layer 20 having a barrier layer for preventing intrusion of moisture is disposed on the polyester film layer 19. The barrier layer 20 is prepared, for example, by coating a vinylidene chloride film on a 14 μm-thick polyester film. A polyester film layer 21 (which is 12 μm thick) is disposed on the barrier layer 20 prepared by coating vinylidene chloride on the polyester film (14 μm thick), and a 1 μm thick, for example, carbon conductive layer 22 is disposed on the polyester film 21. The polyester film 21 has the function of reinforcing mechanical strength and dielectric resistance while the carbon conductive layer 22 has the function of preventing charge. The carbon conductive layer 22 is devoid of degradation with time and does not have humidity dependence. The material of the protective layer 23 has properties such that it protects the carbon conductive layer 22, prevents the occurrence of carbon flake dust and has high abrasion resistance and printability.

Next, the method of using the humidity indicator 15 in the moisture-proofing packaging bag 17 will be explained briefly.

First of all, the bag-like moisture-proofing 15 member 11 which is equipped with the humidity indicator for detecting the internal humidity of the moisture-proofing package 17 on the inner side surface of the transparent bag-like moisture-proofing member 11 at a position where the indicator is visible from outside is prepared, as shown in FIG. 7.

A plurality of containers 13 storing therein a plurality of electronic components 12 such as surface package type semiconductor devices are put into the interior box 14, the interior box 14 is then put into the bag-like moisture-proofing member 11 and its both end portions 11A and 11B are sealed for moisture-proofing packaging.

If the color of the humidity indicator 15 or the caution changes from blue to thin violet at the time of use of the electronic components 12 such as the surface mount package type semiconductor devices, the electronic components 12 are taken out from the moisture-proofing packaging bag 17, are then baked at 125° C. for 24 hours and packaging is then made by solder reflow, infrared lamp or vapor phase reflow.

As can be understood from the description given above, since this embodiment disposes the humidity indicator 15 for detecting the internal humidity of the transparent moisture-proofing bag 17 at the position where it is visible from outside, the state of hygroscopicity inside the bag 17 can be confirmed from outside the bag. Accordingly, management of the moisture-proofing bags 17 can be made easily.

This embodiment can be applied to packaging of all those electronic components other than the surface mount package type semiconductor devices described above which are affected by humidity.

[Embodiment 3]

The third embodiment of the present invention and a semiconductor process which is common to the foregoing two embodiments will be explained with reference to the drawings.

Hereinafter, the description will be made primarily on DRAM by way of example.

(1) Fabrication process in general:

The structure and processes of the semiconductor chip (DRAM, logic IC) as the essence of the semiconductor devices (integrated circuit devices, electronic devices) dealt with in the present invention are described in U.S. Pat. No. 4,612,565 (U.S. Ser. No. 783,531, filed Oct. 3, 1985) and No. 4,625,227 (U.S. Ser. No. 744,151, filed Jun. 13, 1985), Therefore, the description will be made by referring partly to these references.

Figure 1:
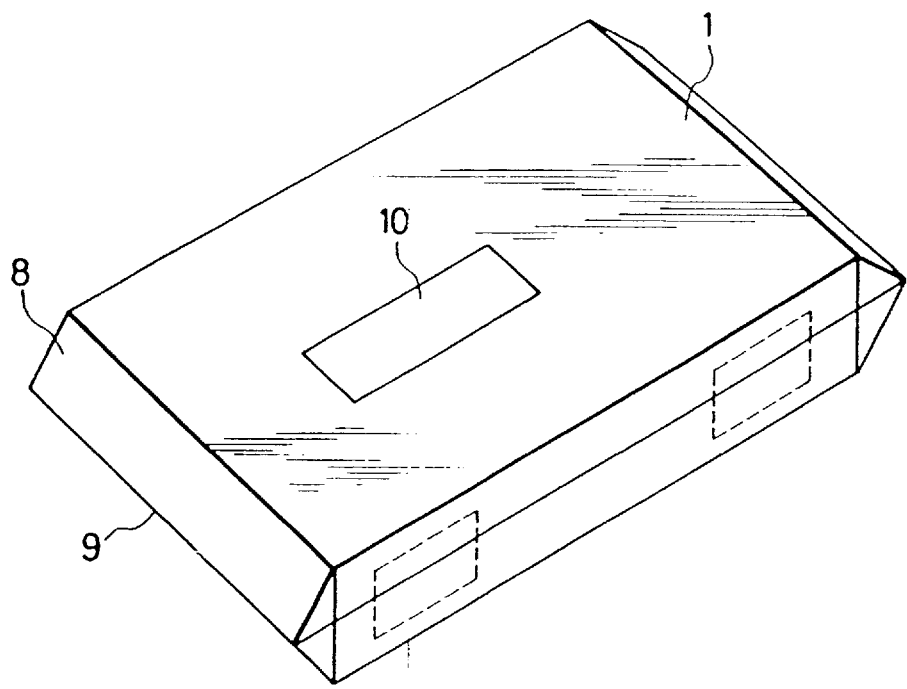
FIG. 1 is a perspective view of a package in accordance with the first embodiment of the present invention.

After a wafer step is complete, a wafer is split into each chip by dicing using a rotary blade. The fabrication steps before and after the wafer steps are described in "Electric Integrated Circuits", John Allison, 1975, by McGraw Hill Book Company, pp. 5–10, particularly in FIG. 1.3 (p. 7). As to the dicing technique, refer to U.S. Pat. No. 4,016,855 (U.S. Ser. No. 608,733, filed Aug. 28, 1975).

Thereafter, each chip is die-bonded to a lead frame. For detail of die-bonding of various kinds of chips, refer to U.S. patent application Ser. No. 256,110 (filed Apr. 21, 1981), U.S. patent application Ser. No. 874,121 (filed Jun. 13, 1986), U.S. patent application Ser. No. 845,332 (filed Mar. 21, 1986), U.S. patent application Ser. No. 843,611 (filed Mar. 25, 1986), U.S. patent application Ser. No. 898,534 (filed Aug. 21, 1986), U.S. patent application Ser. No. 740,420 (filed Jun. 3, 1985), U.S. patent application Ser. No. 758,030 (filed Jul. 23, 1985) and U.S. patent application Ser. No. 767,598 (filed Aug. 20, 1985).

Next, each bonding pad of each pellet and the inner lead terminal of the lead frame are bonded by a bonding wires (about 30 μm thick) of Cu, At, Au, or the like. Besides the various U.S. Patents and Patent Applications described above, refer also for the detail of this bonding technique to U.S. Pat. No. 4,564,734 (U.S. Ser. No. 476,268, filed Mar. 17, 1983), U.S. Pat. No. 4,301,464 (U.S. Ser. No. 55,070, filed Jul. 5, 1979), U.S. patent application Ser. No. 898,535 (filed Aug. 21, 1986), and U.S. patent application Ser. No. 723,645 (filed Apr. 16, 1985).

Furthermore, an about 20 to 200 μm-thick high purity polyimide layer or silicon resin layer is formed by potting on the chip after completion of bonding in order to prevent any soft errors by α-rays. For the detail of resin coating, refer to U.S. patent application Ser. No. 256,110. Resin coating for preventing the α-ray soft error may be carried out during the wafer process. At this time, a suitable thickness is from about 10 μm to about 80 μm aid the resin coating is formed by the combination of spin coating with photolithography in such a manner as to cover at least the memory cell mat.

After wire bonding is complete, the lead frame is molded into an epoxy resin material by transfer mold. As to the molding technique, refer to various U.S. Patents and Patent Applications described above as well as to "VLSI Technology", S. M. Size, 1983, by McGraw-Hill Book Company, pp. 574–581.

After molding is complete, the lead frame is withdrawn from the molding die and after any fins on the lead are completely removed, the unnecessary portions of the lead frame are cut off, the molded member is cut away from the frame and the leads are shaped in a desired shape.

After these steps, the products are selected and marking is applied to the approved products. This marking step may be made before cutting the leads. In other words, Sn or the like is plated to the surface of the exposed lead frame after resin molding by electroplating. Thereafter, the resin molded member and the exposed surface of the lead frame are cleansed (washed with water) to remove the plating solution attaching to them, and after they are dried, they are put to an automatic marking machine for applying the mark.

In this marking, marks representing the kind of products, class, and the like, are simultaneously put to the resin-molded member such as MOS semiconductor devices by offset marking using a rotary drum (transfer drum) or relief direct mark while the lead frame to which a plurality of semiconductor devices are fixed is moved in a predetermined direction. At this time, static electricity develops between the transfer drum or the relief and the resin molded member, but since the frame is kept as a whole at the same potential, the static electricity does not affect the interior of the semiconductor pellet but is grounded. Thereafter, the printed marks are baked or dried by a ultraviolet or infrared dryer or mere heat-treatment and adhered tightly to the resin molded member.

Thereafter, each semiconductor device is separated by punching, cutting and bending and each lead of each MOS semiconductor device or the like becomes simultaneously an independent lead. The leads are bent in the L-shape on the same side and a dual-in type MOS semiconductor device or the like free from dielectric breakdown is thus completed.

As described above, baking (mark baking) is made at 150° C. for 3 to 5 hours in the case of marking by the ink. If laser marking is employed, on the other hand, baking for drying the ink is not particularly required. For the detail of laser marking, refer to U.S. patent application Ser. No. 720,884 (filed Apr. 8, 1985).

After baking is complete, the resin molded electronic devices (such as integrated circuit devices, semiconductor devices) are put into the moisture-proofing bag shown in the foregoing two embodiments, either directly or through a suitable auxiliary member (magazine, tray, tape, reel, etc.), within a few days and preferably, within a few hours after completion, together with a desiccant such as silica gel, and are then sealed air-tight.

Thereafter, the resin molded devices are packed into a shipment cardboard box or the like for shipment while being sealed in the bag.

These semiconductor devices are taken out from the moisture-proofing bag immediately before mounting. In an ordinary environment, they are taken out within two to three days or within a few hours, before use. The inventors of this invention found out that if they are exposed to the external air for more than one week, they absorb substantially completely the moisture in the external air. Various solder reflow processes are used for mounting the semiconductor devices.

Figure 9:
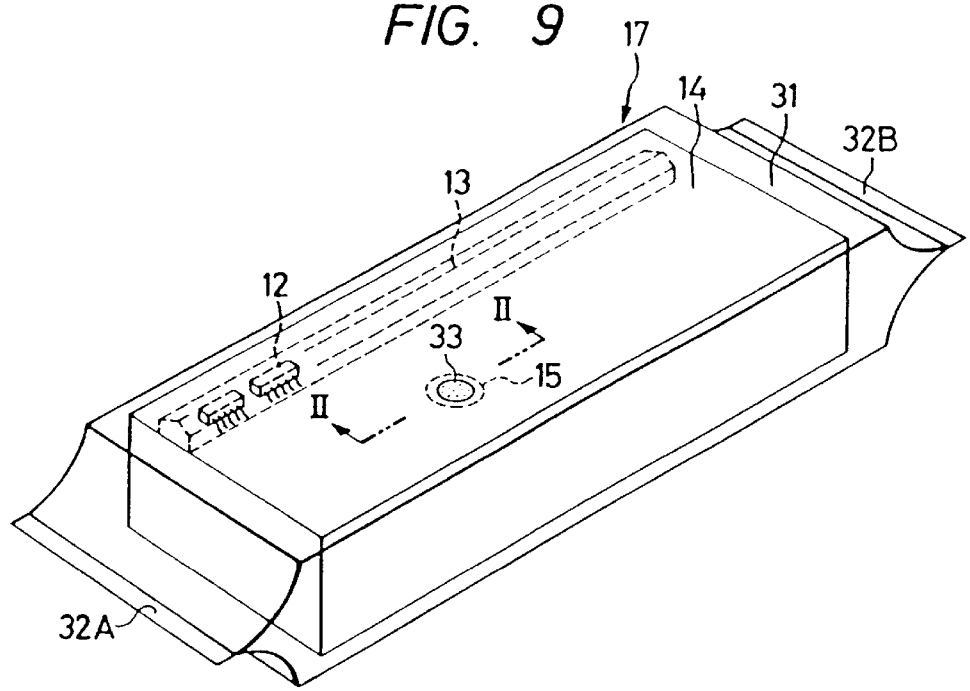
FIG. 9 is a perspective view showing the appearance and construction of a transparent moisture-proofing packaging bag in accordance with the third embodiment of the present invention.

(2) Detail of moisture-proofing bag and its film:

FIG. 9 is a perspective view showing the appearance and structure of an opaque moisture-proofing bag of this embodiment.

As shown in FIG. 9, the opaque moisture-proofing packaging bag of this embodiment is made of an opaque bag-like moisture-proofing member 11. A plurality of electronic components 12 such as surface mount package type semiconductor devices are put into a container 13 and the containers 13 are then stored in the interior box 14. After this interior box 14 is put into the bag-like moisture-proofing member 31, its both end portions 32A and 32B are sealed for moisture-proofing. When moisture-proofing packaging is made, the humidity indicator 15 for detecting the internal humidity of the moisture-proofing bag 31 is disposed on the inner side surface of the opaque bag-like moisture-proofing member 31 at a position where it is visible from outside.

Next, an example of this humidity indicator 15 will be given.

Cautions are printed on the inner side surface of the transparent bag-like moisture-proofing member 31 by an ink containing a material which changes the color by humidity, such as cobalt chloride. The cautions read, for example, as "If the color of the cautions change from blue to thin violet, take out the surface mount package type semiconductor devices from the moisture-proofing bag and bake them at 125° C. for 24 hours".

Figure 10:
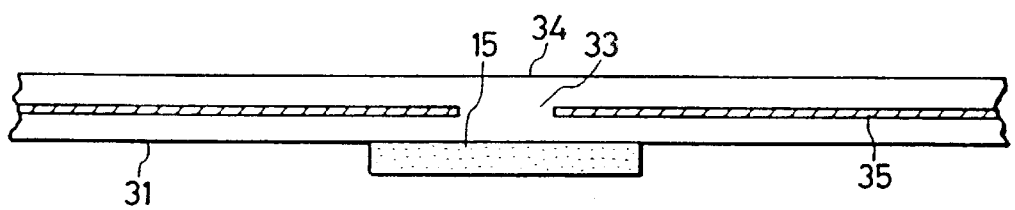
FIG. 10 is an enlarged sectional view taken along line II—II of FIG. 9 and is an enlarged sectional view of a humidity indicator fitted to the inner side surface of a transparent bag-like moisture-proofing member.

As shown in FIGS. 9 and 10, the peripheral portion of the humidity indicator (humidity detection label) 15 is bonded directly to the inside of a transparent window 33 disposed at a part of the opaque moisture-proofing member 31 by an adhesive so that the indicator can be confirmed from outside. This humidity detection label is prepared, for example, by letting paper made of a pulp absorb a material which changes the color by humidity, such as cobalt chloride. For example, it is possible to let the portion of the surface of the interior box corresponding to the window 33 absorb such a material.

As shown in FIGS. 9 and 10, the humidity indicator (humidity detection label) 15 is printed on the interior box 14 of the moisture-proofing packaging bag 31 or the caution is printed there by the material which changes the color by humidity such as cobalt chloride.

When the humidity indicator (humidity detection label) 15 is bonded, there is no need to print the caution by the material changing the color by humidity, such as cobalt chloride.

Next, the moisture-proofing member 34 at the transparent window portion of the moisture-proofing packaging bag comprises a laminate sheet as shown in FIG. 8.

Figure 11:
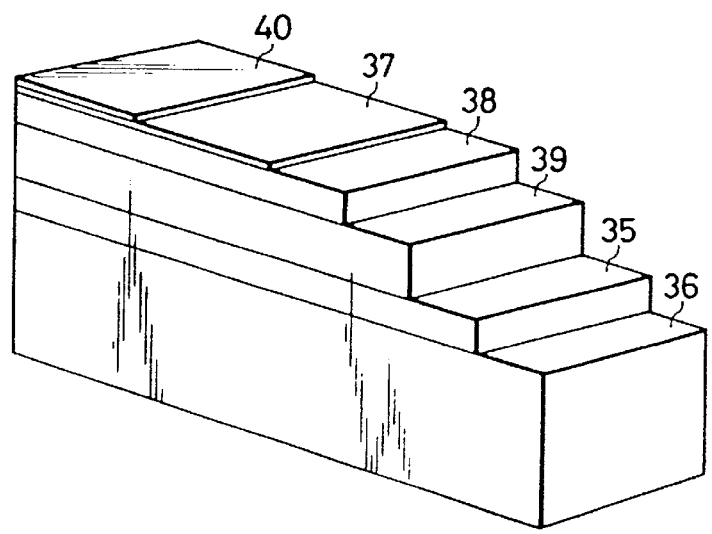
FIG. 11 is a partially cut-away perspective view showing the structure of an opaque bag-like moisture-proofing member of the moisture-proofing packaging bag shown in FIG. 9.

On the other hand, the portions of the moisture-proofing bag other than the transparent window 33 shown in FIG. 10 is made of an opaque sheet having an aluminum film 35 as shown in FIG. 11.

In FIG. 11, reference numeral 36 represents a polyethylene layer into which an antistatic agent is kneaded and which serves as the innermost layer of the moisture-proofing packaging bag 31. The polyethylene layer 36 containing the antistatic agent is 60 μm thick, for example, and has the functions of preventing frictional charge, heat sealability, openability, and the like.

An aluminum foil 35 having high moisture-proofness is spread on this polyethylene layer 36. Since aluminum is a metal, its vapor permeability is extremely lower than that of organic films and can effectively prevent its intrusion. This aluminum is about 10 μm thick, for example. Furthermore, an about 20 μm-thick polyethylene film layer 39 having highheat moldability is disposed on this aluminum. A polyester film layer (which is 12 μm thick) 38 having high mechanical strength and high withstand voltage is disposed on the polyethylene film and a 1 μm-thick carbon conductive layer 37 is disposed on the polyester film layer. Furthermore, an acrylic type protective layer 40 is disposed on the carbon conductive layer 37. The polyester film layer 38 has the function of reinforcing mechanical strength and dielectric resistance while the carbon conductive layer 37 is devoid of degradation with time and does not have humidity dependence. The material of the protective layer 40 has properties such that it protects the carbon conductive layer 37, prevents the carbon flake dust and has high abrasion resistance and high printability.

Next, the method of using the humidity indicator 15 in the moisture-proofing packaging bag 31 of this embodiment will be explained briefly.

First of all, the bag-like moisture-proofing member 31 which is equipped with the humidity indicator 15 disposed at the position of the transparent window 33, where the indicator is visible from outside, on the inner side surface of the moisture-proofing member 11 is prepared. A plurality of electronic components 12 such as the surface mount package type semiconductor devices are stored in the container 13, the containers 13 are then stored in the interior box 14 and after the interior box 14 is put into the bag-like moisture-proofing member 11, its both end portions 32A and 32B are sealed for moisture-proofing.

When the color of the humidity indicator 15 or the caution changes from blue to thin violet when using the electronic components 12 such as the surface mount package type semiconductor devices, the electronic components 12 are taken out from the moisture-proofing bag 31 and baked at 125° C. for 24 hours. Thereafter, they are mounted by solder reflow, infrared lamp or vapor phase reflow.

As can be understood from the description given above, this embodiment disposes the humidity indicator 15 for detecting the internal humidity of the opaque moisture-proofing bag 31 at the position where it is visible from outside. Accordingly, the internal state of hygroscopicity of the bag 31 can be confirmed from outside and its management can be made easily. Since the moisture-proofing bag 31 is not broken, re-packaging is not necessary after confirmation.

This embodiment can be changed or modified in various manners.

For example, the embodiment can be applied to all those electronic components other than the surface mount package type semiconductor devices described above which are affected by the influence of humidity.

Figure 12:
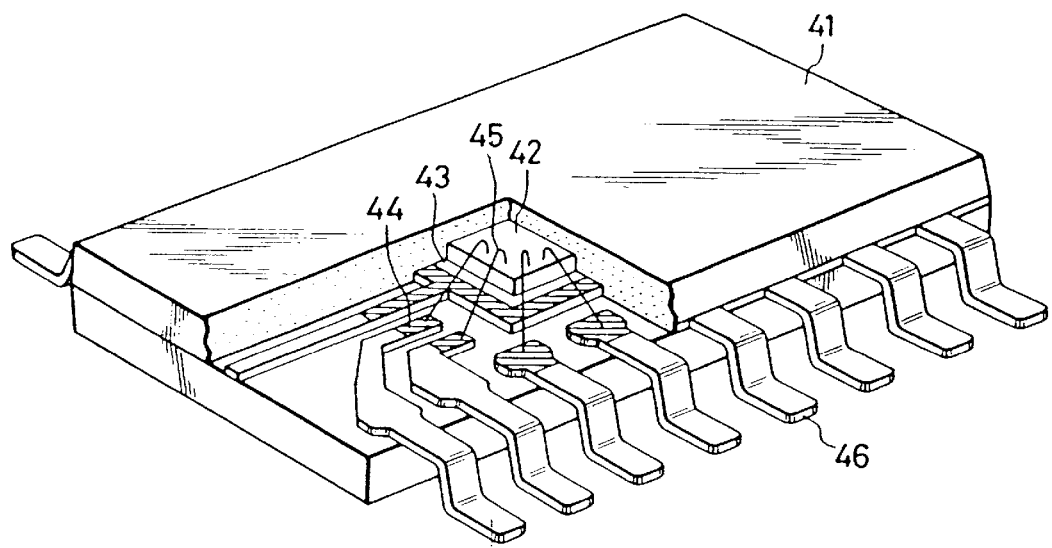
FIGS. 12 to 17 are sectional views showing the appearance of resin-molded semiconductor devices to which the first to third embodiments of the present invention are applied.

(3) Detail of resin molded electronic-devices as object of application:

FIG. 12 shows a package which is called a "gull wing" and generally a "Small Outline Package (SOP)".

Figure 13:
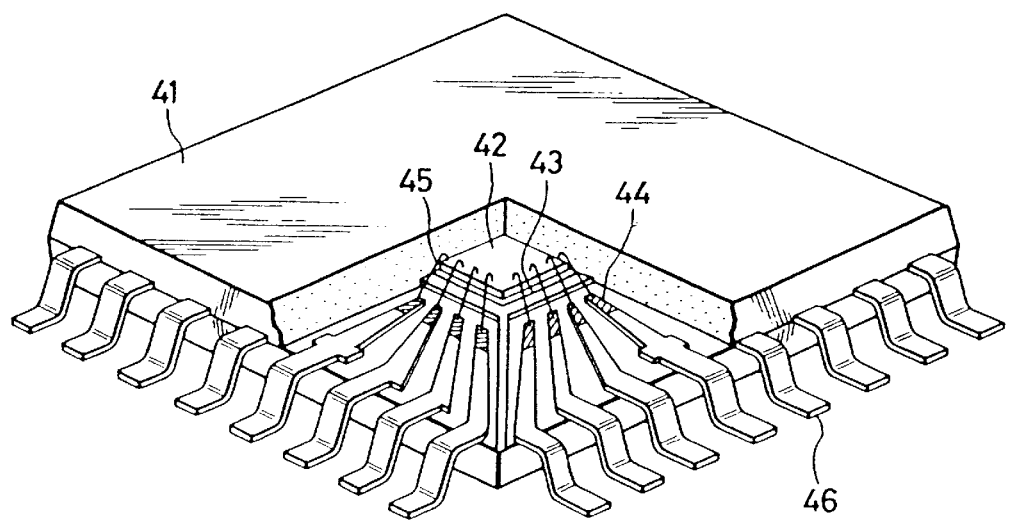
Figure 14:
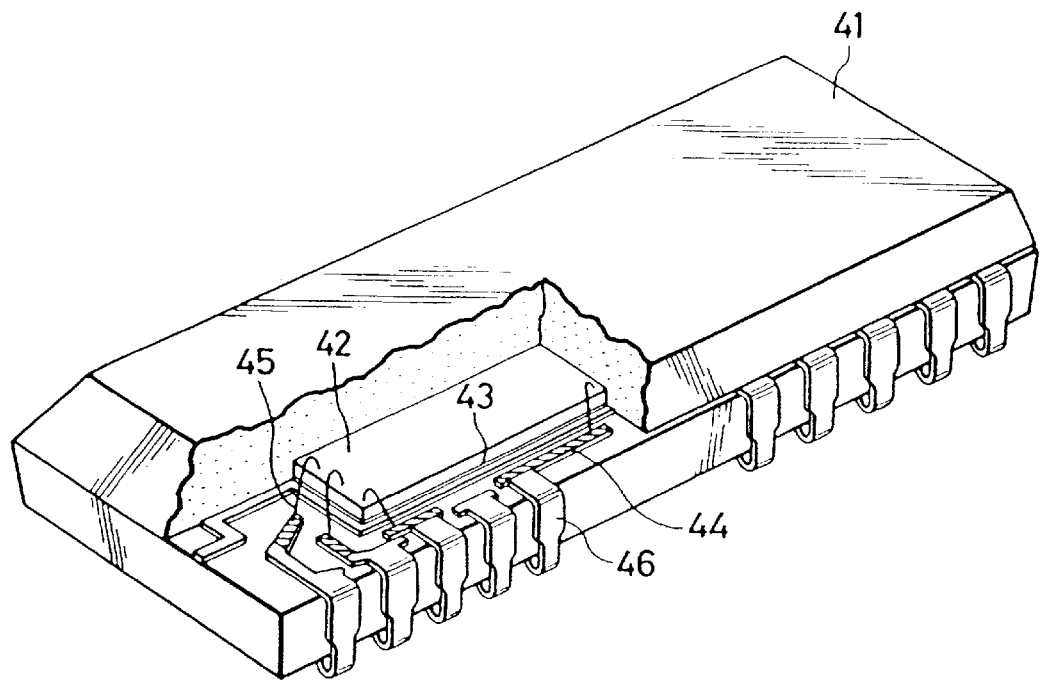
Figure 15:
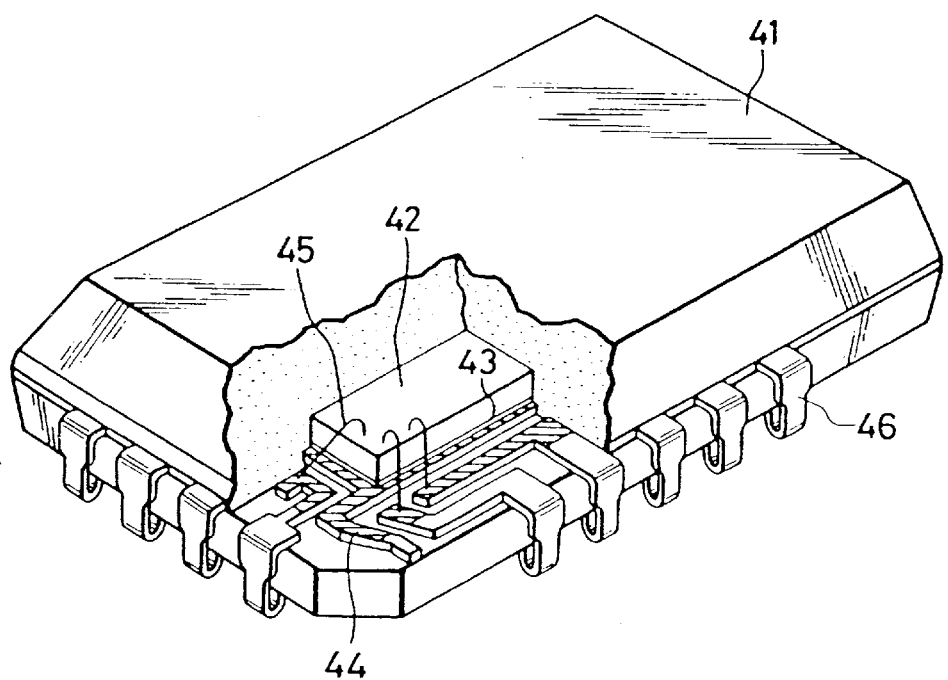
Figure 16:
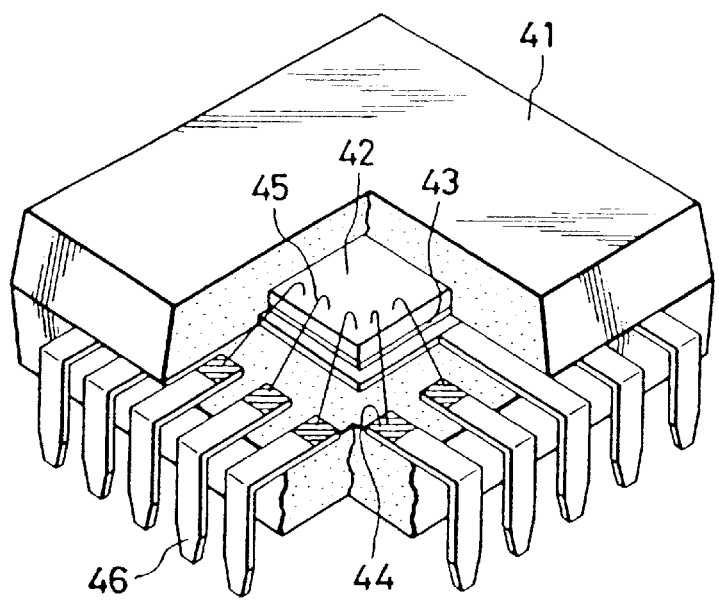

FIG. 13 shows a surface mount package type package which is called a "flat plastic package (FPP) or a squad flat package (QFP)". Furthermore, FIG. 14 shows a package for use specially for a memory or the like, which is called a "small outline J-bend package (SOJ)". FIG. 15 shows a package which is called a "plastic leaded chip carrier (PLCC)" and is used for high density surface mount package. FIG. 16 shows a package which belongs to a butt lead type and is called a "mini-squad package (MSP)".

Figure 17:
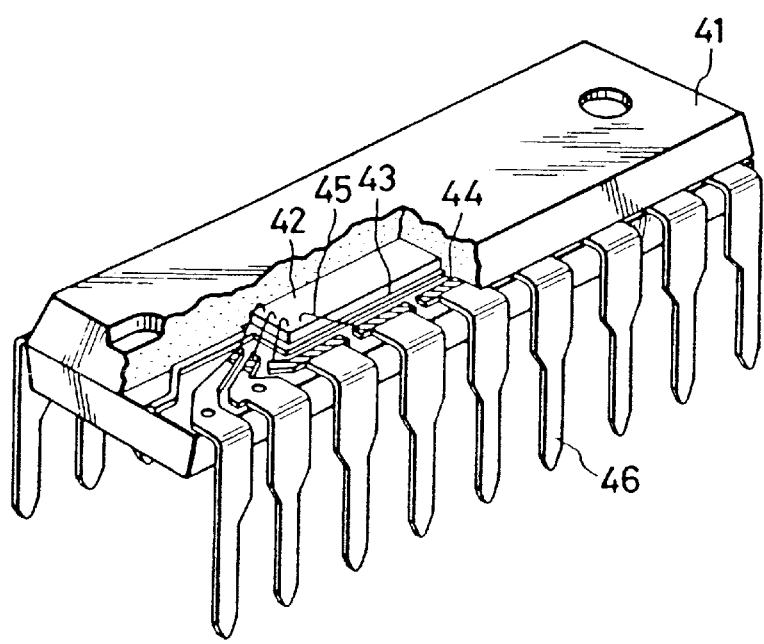

Unlike the packages shown already, the package shown in FIG. 17 is of a type in which leads are fitted into holes of a substrate. Therefore, it belongs to an insert type and is generally called a "dual in-line package (DIP)".

In FIGS. 12 to 17 described above, the semiconductor chip 42 is fixed to a holder such as tabs or islands made of a thin metal sheet through an Ag paste 43. The bonding pads on the chip and the inner leads having the Ag spot plating layer 44 formed thereon are subjected to ball and wedge bonding by capillary by an Au wire 45 (30 μm diameter), or the like. The leads 46 are formed by punching out from a 42-alloy or a copper alloy film. They are transfer-molded by an epoxy resin 41.

(4) Detail of conveying auxiliary member:

A large number of resin molded devices are stored in various conveying auxiliary member and are then sealed air-tight depending upon their applications.

The auxiliary member will now be explained.

Figure 18:
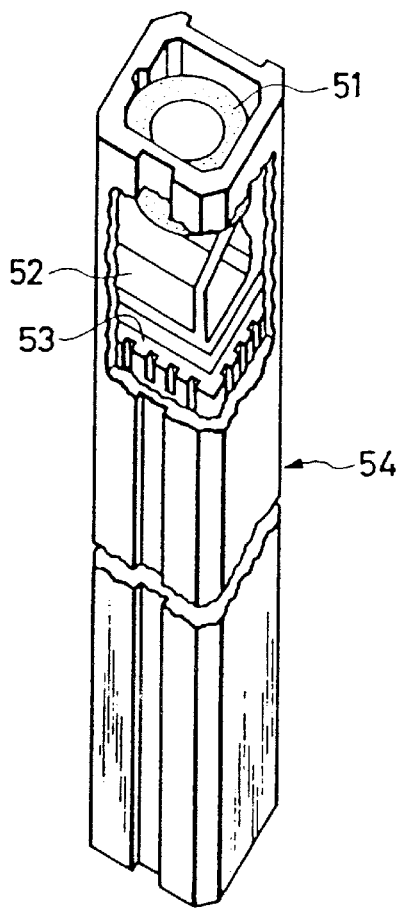
FIGS. 18 to 20 show examples of conveying auxiliary members used in the first to third embodiments of the present invention, respectively.

FIG. 18 shows the state of a magazine 54 and the resin molded devices (transistors, ICs, LSIs, etc.) stored in the magazine 54. MSP type resin molded devices 53 are stacked vertically inside the magazine 54 and a polyethylene sub-stopper 52 and a main stopper made of hard nitrile rubber are packed into the end portion of the magazine. The magazine main body is made of hard polystylol containing carbon or electrically conductive soft vinyl chloride.

Figure 19:
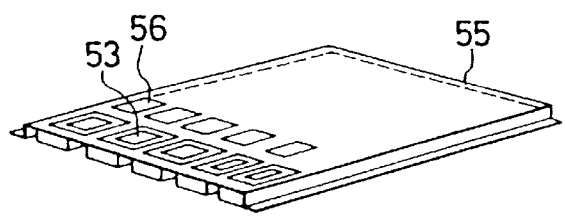

FIG. 19 shows a tray 55 as one of the auxiliary members. The tray is made of vinyl chloride to which antistatic treatment is applied, and the resin molded devices 53 are put into square-recesses 56 that are aligned in the form of array. In this case, it is possible to put directly silica gel or the like into each recess 56 and to seal the upper surface air-tight by the moisture-proofing sheet. Generally, after the trays are stacked, they are put into the interior box made of paper and then sealed into the moisture-proofing bag.

Figure 20:
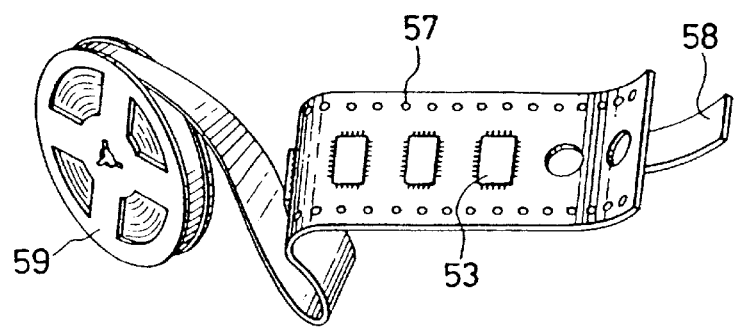

FIG. 20 shows an auxiliary member which is called a "tape and reel" system. The resin molded devices 53 are held in a line on a carrier tape 57 wound on a reel 59. through an adhesive tape 58. After the carrier tape 57 is wound on the reel 59, the reel is sealed air-tight one by one in the moisture-proofing bag.

FIG. 21A, 21B and 21C show another type of the tape and reel system. In this case, the resin molded devices 53 are stored in the square recesses 56 formed in a line on the carrier type 57 and their upper surface is heat-sealed by a cover tape 60. The tape is wound on the reel under this state and the reel is sealed moisture-tight in the same way as above. In this case, too, the external moisture-proofing sheet can be eliminated by changing the cover tape 60 to the moisture-proofing sheet shown in FIG. 8 and 11 and putting silica gel or the like into each recess 56.

Incidentally, refer to U.S. patent application Ser. No. 879,012 (filed Jun. 26, 1986) for the detail of production of magazine and the like.

Figure 22:
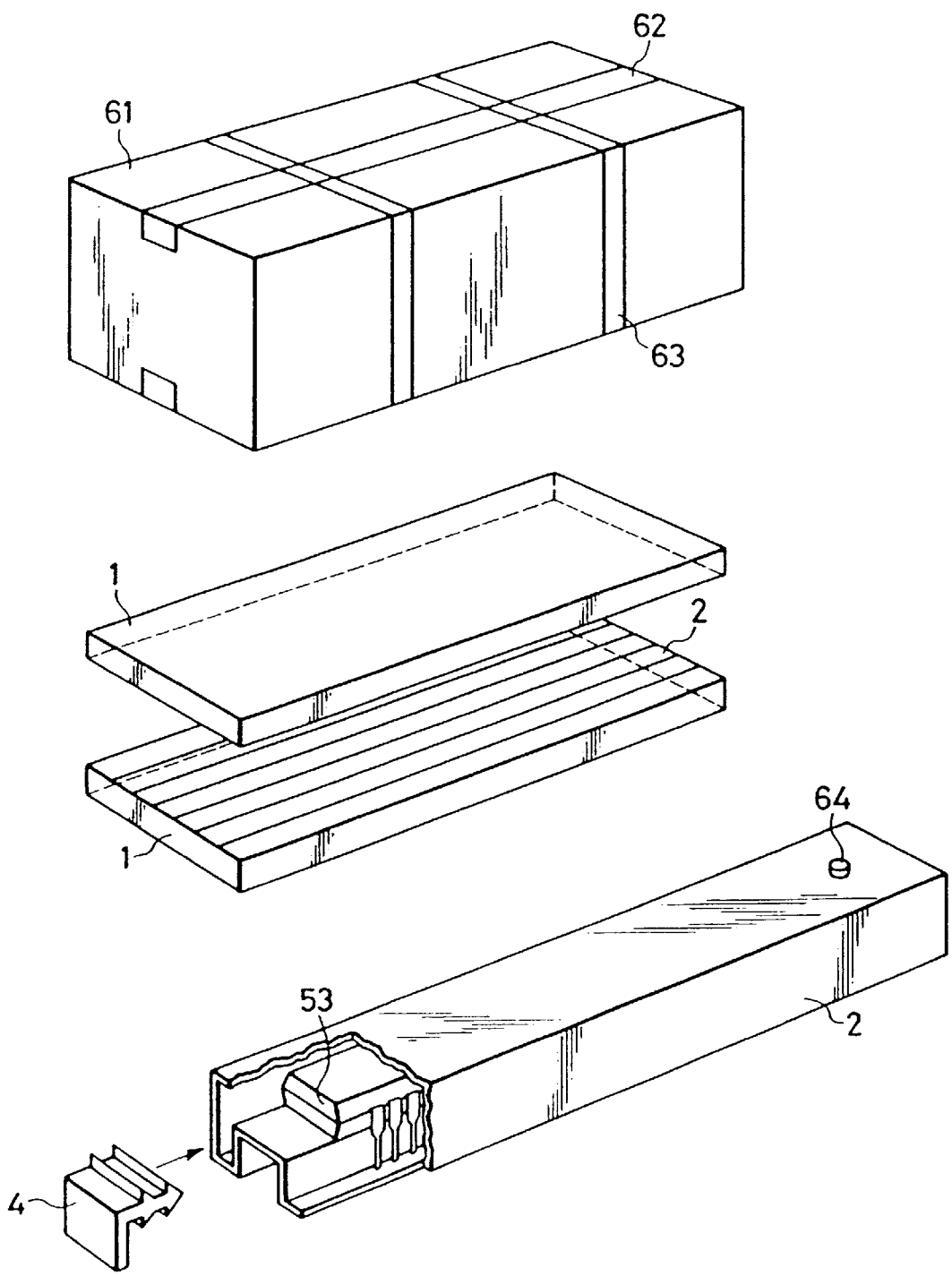
FIG. 22 is an explanatory view showing in detail the packaging method in the first to third embodiments of the present invention.

(5) Detail of shipment package of ICs or the like:

FIG. 22 shows an example of a shipment package of resin molded devices 53 (plug-in type or surface mount package type devices). A number of resin molded devices 53 are stored in a line inside the tube-like magazine 2 and secured fixedly by a stopper pin 64 and a stopper filler 4. A predetermined number of magazines are stored in the interior box 1 having low hygroscopicity, made of paper or sheet and stored inside the bag made of the moisture-proofing sheet such as shown in FIGS. 8 or 11. The internal pressure of the bag becomes somewhat lower than that of the external air and deaeration is made so that the moisture-proofing bag comes substantially into close contact with the outer surface of the interior box and air-tight sealing is then made by pressurization or by heating. In this manner, the interior boxes can be stored easily in the exterior box and the storage space becomes small.

On the other hand, the existence of any pin-holes can be discriminated easily by putting dry $N_2$, which may be somewhat pressurized, into the bag in order to secure a gap between the moisture-proofing sheet and the interior box.

Though the description given above primarily deals with the magazine by way of example, packaging can be made substantially in the same way as above in the case of the tray and the tape and reel. In addition, either one or a plurality of the resin molded ICs may be put directly into the moisture-proofing bag.

It is also possible to put and seal the auxiliary member directly into the moisture-proofing bag without using the interior box.

Though the desiccant is put into a paper bag or the like and then placed inside the interior box, it may be placed at a suitable air-tight position such as the recess of the magazine or the carrier tape. For instance, the desiccant may be coated and diffused on the inner surface of the moisture-proofing sheet.

As described above, a predetermined number of moisture-proofing bags that have been sealed air-tight are stored in the exterior box 61 made of the cardboard and sealed by the adhesive tape 62. After the box is bound by bands 63, the box is shipped.

As to other air-tight sealing methods, particularly the method which uses the tray, refer to the afore-mentioned reference Japanese Patent Laid-Open No. 178877/1986.

(6) Detail of memory chips and DRAM devices:

The relationship between the sectional structure of the memory IC device and the package in the present invention will be explained. Here, the SOP type package will be described by way of example.

Figure 23:
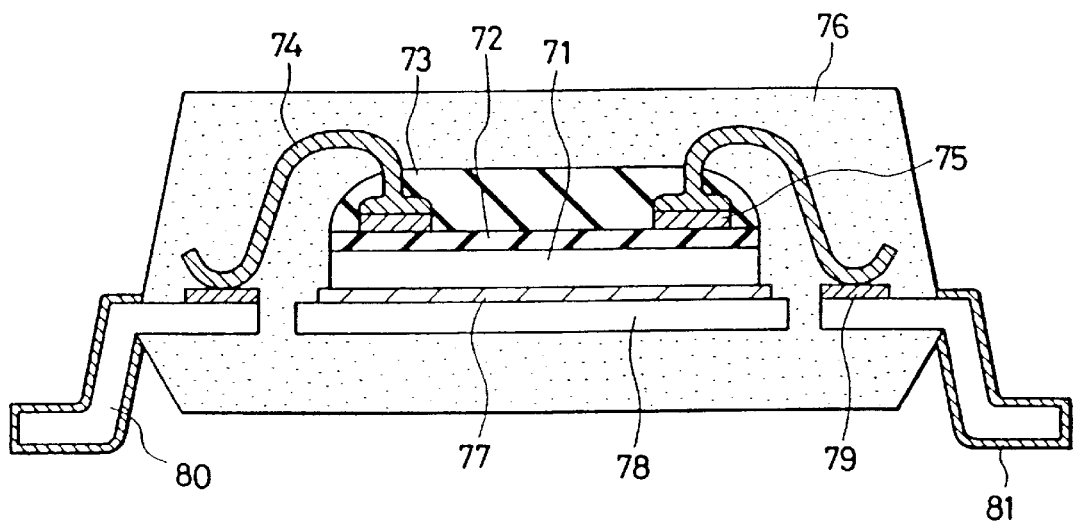
FIG. 23 is a sectional view of a memory IC device dealt with in the first to third embodiments of the present invention.

In FIG. 23, a very large number (about 1,000,000) of FETs constituting DRAM are formed on the upper main plane of the Si substrate 71. On the Si substrate are formed field oxide films forming these devices, insulation films (inorganic films) 72 made of an interlevel PSG (phospho silicate glass), and the like. A number of Al bonding pads 75 are disposed further thereon.

On the other hand, the Si substrate 71 is fixed on its lower main plane to the islands or tabs 78 through the Ag paste 77. The size of this chip 71 is about 10 mm×5 mm×0.4 mm (high×wide×thick). The lead 80 is made of the same 42-alloy as that of the islands, and partial Ag plating 79 is disposed at the inner lead portion. After ball and wedge bonding is made to the gap between the inner end of the lead 80 and the bonding pad by an Au wire having a 30 μm diameter, a polyimide resin 73 is formed by potting onto substantially the entire upper surface of the chip from above the former. Thereafter, the structure is transfer-molded by an epoxy resin 76 in a lead frame unit. Solder plating 81 is applied to the lead portions protruding from the mold resin 76.

At this time, the 42-alloy member of the lead and island portion is 0.15 mm thick, the mold resin on the upper surface of the package is about 1 mm thick, the polyimide film is about 0.1 mm thick, the Ag paste is about 50 μm thick and the lower surface of the mold resin is about 1 mm thick:

In the package sealed by such a thin resin, if the absorbed moisture content is great, evaporation and expansion of the moisture occur first on the lower surface of the tab 78 due to drastic heating at the time of soldering and packaging. Subsequently, peel occurs between the resin and the metal and the package swells. The inventors found out that if the resin cannot withstand the resulting stress at this time, package crack develops.

(7) Detail of the package mounting process:

First of all, the outline of the surface mounting process will be given.

Desired wirings are formed on the substrate made of glass-epoxy resin, or the like, by a Cu film or the like, and a solder paste is formed by screen printing or the like at solder portions (foot print) on the substrate. Then, the resin molded devices are mounted onto the solder paste by a vacuum chuck or like means, and solder in the paste is fused for soldering by the solder reflow method such as vapor phase reflow, heating furnace, infrared reflow, and like means.

Figure 24:
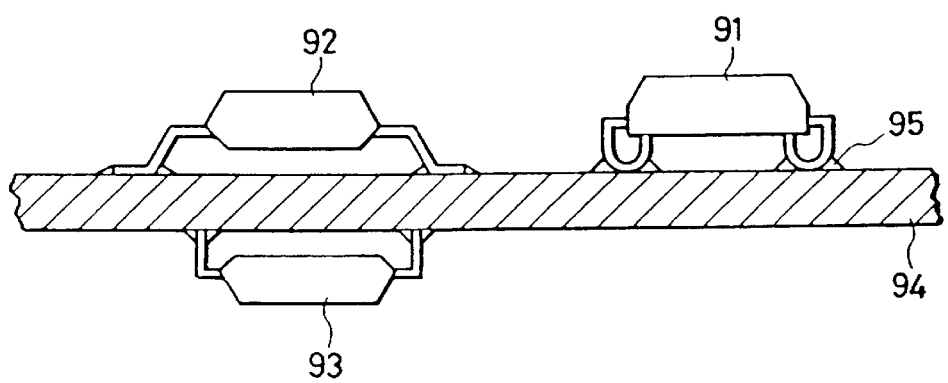
FIG. 24 is a schematic view showing the completed state of surface packaging in the first to third embodiments of the present invention.

FIG. 24 shows the state of mounting. In the drawing, reference numeral 91 represents the resin molded device of the SOJ type, 92 is the resin molded device of the SOP type and 93 is the resin molded device of the MSP type. Reference numeral 94 represents the wiring substrate and 95 is the solder which is reflowed or dipped.

Figure 25A:
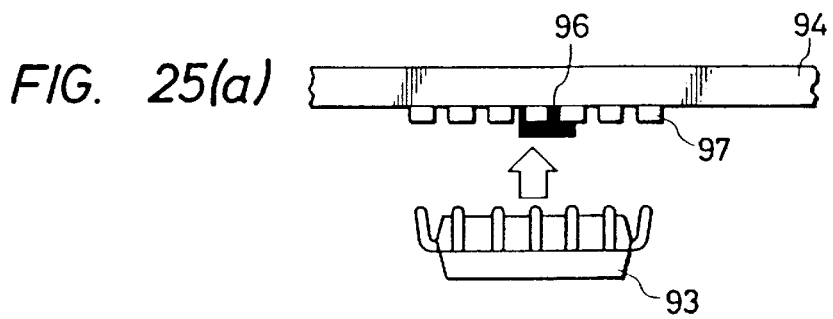
FIGS. 25($a$), 25($b$) and 25($c$) are schematic views of a solder dipping method of a similar package.
Figure 25B:
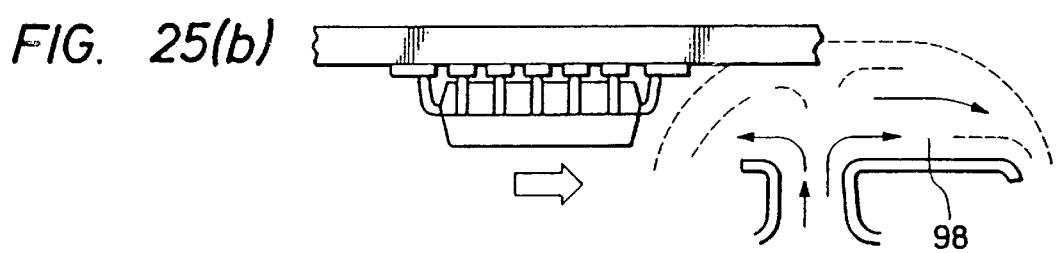
Figure 25C:
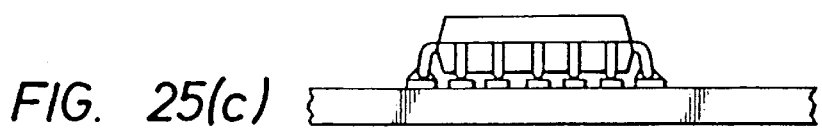

FIGS. 25(*a*), 25(*b*) and 25(*c*) show the solder dipping method. As shown in FIG. 25(*a*), the resin molded device 93 of the MSP type is fixed in such a manner that its leads are placed on the screen-printed solder paste on the substrate 94 by the adhesive 96. Subsequently, it is dipped downwardly into the solder stream 98 as shown in FIG. 25(*b*) and is then cooled in such a manner as to attain the state shown in FIG. 25(*c*).

Though the present invention has thus been described with reference to some preferred embodiments thereof, it will be obvious to those skilled in the art that the invention is not particularly limited thereto but can be changed or modified in various manners without departing from the spirit and scope thereof.

What is claimed is:

1. A packaged device comprising:
   a moisture-proofing bag;
   a surface mount semiconductor device, to be mounted on a printed circuit board, sealed in said moisture-proofing bag, said surface mount semiconductor device being a device which will be subject to heat when said surface mount semiconductor device is surface-mounted on a printed circuit board;
   a desiccant sealed in said moisture-proofing bag; and
   cautions provided for the moisture-proofing bag, that the devices should be prevented from moisture absorption after opening the bag.

2. A packaged device according to claim 1, wherein said cautions are printed on a surface of the moisture-proofing bag.

3. A packaged device according to claim 1, wherein a label bearing said cautions is bonded to a surface of the moisture-proofing bag.

4. A packaged device according to claim 1, wherein said moisture-proofing bag is made of a laminate film that includes a layer for preventing entry of moisture.

5. A packaged device comprising:
   a moisture-proofing bag made of a laminate film;
   a surface mount semiconductor device, to be mounted on a printed circuit board, sealed in said moisture-proofing bag, said surface mount semiconductor device being a device which will be subject to heat when said surface mount semiconductor device is surface-mounted on a printed circuit board;

a desiccant sealed in said moisture-proofing bag; and cautions provided for the moisture-proofing bag, that the devices should be used rapidly after opening the bag and should be kept in an environment of low humidity.

6. A packaged device comprising:

a moisture-proofing bag made of a laminate film;

a surface mount semiconductor device, to be mounted on a printed circuit board, sealed in said moisture-proofing bag, said surface mount semiconductor device being a device which will be subject to heat when said surface mount semiconductor device is surface-mounted on a printed circuit board;

a desiccant sealed in said moisture-proofing bag; and cautions provided for the moisture-proofing bag, that the devices should be used rapidly after opening the bag.

7. A packaged device according to claim 6, wherein said cautions are printed on a surface of the moisture-proofing bag.

8. A packaged device according to claim 6, wherein a label bearing said cautions is bonded to a surface of the moisture-proofing bag.

9. A packaged device according to claim 6, wherein said moisture-proofing bag includes a layer for preventing entry of moisture.

10. A packaged device according to claim 6, wherein said moisture-proofing bag includes a barrier layer for preventing entry of moisture, an inner charge-preventing layer formed inside of said barrier layer and an outer charge-preventing layer formed outside of said barrier layer.

11. A packaged device according to claim 6, wherein said moisture-proofing bag is sealed by heat-sealing.

12. A packaged device according to claim 6, wherein said moisture-proofing bag is sealed by deaeration and heat-sealing.

13. A packaged device comprising:

a moisture-proofing bag made of a laminate film;

A surface mount semiconductor device, to be mounted on a printed circuit board, sealed in said moisture-proofing bag, said surface mount semiconductor device being a device which will be subject to heat when said surface mount semiconductor device is surface-mounted on a printed circuit board;

a desiccant sealed in said moisture-proofing bag; and cautions provided for the moisture-proofing bag, that the bag should be kept in the environment of low humidity after being opened.

14. A packaged device according to claim 13, wherein said cautions are printed on a surface of the moisture-proofing bag.

15. A packaged device according to claim 13, wherein a label bearing said cautions is bonded to a surface of the moisture-proofing bag.

16. A packaged device according to claim 13, wherein said moisture-proofing bag includes a layer for preventing entry of moisture.

17. A packaged device according to claim 13, wherein said moisture-proofing bag includes a barrier layer for preventing entry of moisture, an inner charge-preventing layer formed inside of said barrier layer and an outer charge-preventing layer formed outside of said barrier layer.

18. A packaged device according to claim 13, wherein said moisture-proofing bag is sealed by heat-sealing.

19. A packaged device according to claim 13, wherein said moisture-proofing bag is sealed by deaeration and heat-sealing.

20. A packaged device comprising:

a moisture-proofing bag;

a surface mount semiconductor device, to be mounted on a printed circuit board, sealed in said moisture-proofing bag, said surface mount semiconductor device being a device which will be subject to heat when said surface mount semiconductor device is surface-mounted on a printed circuit board;

a desiccant sealed in said moisture-proofing bag; and cautions provided for the moisture-proofing bag, that the devices should be dried before the device is surface-mounted, when the devices have the prospects of moisture being absorbed.

21. A packaged device comprising:

a moisture-proofing bag;

a surface mount semiconductor device, to be mounted on a printed circuit board, sealed in said moisture-proofing bag, said surface mount semiconductor device being a device which will be subject to heat when said surface mount semiconductor device is surface-mounted on a printed circuit board;

a desiccant sealed in said moisture-proofing bag; and cautions provided for the moisture-proofing bag, that the devices should be baked before the device is surface-mounted, when the devices have the prospects of moisture being absorbed.

22. A packaged device according to claim 21, wherein said moisture-proofing bag is made of a laminate film that includes a layer for preventing entry of moisture.

23. A packaged device according to claim 21, wherein said moisture-proofing bag is made of a laminate film that includes a barrier layer for preventing entry of moisture, an inner charge-preventing layer formed inside of said barrier layer and an outer charge-preventing layer formed outside of said barrier layer.

24. A packaged device according to claim 21, wherein said moisture-proofing bag is sealed by heat-sealing.

25. A packaged device according to claim 21, wherein said moisture-proofing bag is sealed by deaeration and heat-sealing.

26. A packaged device comprising:

a moisture-proofing bag;

a surface mount semiconductor device, to be mounted on a printed circuit board, sealed in said moisture-proofing bag, said surface mount semiconductor device being a device which will be subject to heat when said surface mount semiconductor device is surface-mounted on a printed circuit board;

a desiccant sealed in said moisture-proofing bag; and cautions provided for the moisture-proofing bag, that the devices should be baked at 125 degrees Celsius before the device is surface-mounted, when the devices have the prospects of moisture being absorbed.

27. A packaged device comprising:

a moisture-proofing bag;

a surface mount semiconductor device, to be mounted on a printed circuit board, sealed in said moisture-proofing bag, said surface mount semiconductor device being a device which will be subject to heat when said surface mount semiconductor device is surface-mounted on a printed circuit board;

a desiccant sealed in said moisture-proofing bag; and cautions provided for the moisture-proofing bag, that the devices should be baked at 125 degrees Celsius for 24 hours before the device is surface-mounted, when the devices have the prospects of moisture being absorbed.

28. A packaged device comprising:

a moisture-proofing bag;

a surface mount semiconductor device, to be mounted on a printed circuit board, sealed in said moisture-proofing bag, said surface mount semiconductor device being a device which will be subject to heat when said surface mount semiconductor device is surface-mounted on a printed circuit board;

a desiccant sealed in said moisture-proofing bag;

an indicator sealed in said moisture-proofing bag; and cautions provided for the moisture-proofing bag, that the devices should be baked before the device is surface-mounted, when the indicator changes color due to presence of moisture.

29. A packaged device according to claim 28, wherein said moisture-proofing bag is made of a laminate film that includes a layer for preventing entry of moisture.

* * * * *